(12) United States Patent
Kim et al.

(10) Patent No.: US 10,131,346 B2
(45) Date of Patent: Nov. 20, 2018

(54) METHOD FOR DIAGNOSING DEMAGNETIZATION OF MOTOR OF ECO-FRIENDLY VEHICLE

(71) Applicant: Hyundai Motor Company, Seoul (KR)

(72) Inventors: Seong Min Kim, Gyeongsangnam-do (KR); Jae Sang Lim, Gyeonggi-do (KR); Kil Young Youn, Gyeonggi-Do (KR); Ji Wan Cha, Incheon (KR); Young Un Kim, Gyeonggi-do (KR); Jeong Won Rho, Seoul (KR)

(73) Assignee: Hyundai Motor Company, Seoul (KR)

( * ) Notice: Subject to any disclaimer, the term of this patent is extended or adjusted under 35 U.S.C. 154(b) by 2 days.

(21) Appl. No.: 14/960,365

(22) Filed: Dec. 5, 2015

(65) Prior Publication Data

US 2016/0368487 A1    Dec. 22, 2016

(30) Foreign Application Priority Data

Jun. 18, 2015 (KR) .......................... 10-2015-0086531

(51) Int. Cl.
  B60W 20/50 (2016.01)
  B60W 10/08 (2006.01)
  (Continued)

(52) U.S. Cl.
  CPC ........... B60W 20/50 (2013.01); B60L 3/0061 (2013.01); B60L 3/12 (2013.01); B60L 15/20 (2013.01);
  (Continued)

(58) Field of Classification Search
  CPC ............... B60W 20/50; B60W 10/08; B60W 2710/083; B60W 2400/00; B60L 3/0061;
  (Continued)

(56) References Cited

U.S. PATENT DOCUMENTS

| 4,039,853 A * | 8/1977 | Koizumi ............... H01F 13/003 307/101 |
| 4,471,252 A * | 9/1984 | West ....................... F02N 11/00 310/154.27 |

(Continued)

FOREIGN PATENT DOCUMENTS

| JP | 10-056799 | 2/1998 |
| JP | 2010-268599 A | 11/2010 |

(Continued)

*Primary Examiner* — Jelani A Smith
*Assistant Examiner* — Majdi Alsomiri
(74) *Attorney, Agent, or Firm* — Mintz Levin Cohn Ferris Glovsky and Popeo, P.C.; Peter F. Corless

(57) ABSTRACT

A method for diagnosing demagnetization of a motor of a vehicle can accurately diagnose an irreversible demagnetization state of a permanent magnet of a traction motor or a hybrid starter-generator (HSG) without additional hardware, while minimizing influence of irreversible demagnetization of the permanent magnet of the traction motor or the HSG on vehicle performance. The method includes acquiring operating state information of the motor, determining whether a diagnosis entrance condition including a state in which the motor performs an electricity generating operation is satisfied based on the acquired operating state information of the motor, acquiring a direct current (DC) value in diagnosis, and determining whether irreversible demagnetization occurs by comparing the acquired DC value in diagnosis with a pre-stored DC current value in a normal state of the permanent magnet.

12 Claims, 3 Drawing Sheets

(51) Int. Cl.
  *B60L 11/18* (2006.01)
  *B60L 15/20* (2006.01)
  *G01R 31/34* (2006.01)
  *G01R 31/00* (2006.01)
  *B60L 3/00* (2006.01)
  *B60L 3/12* (2006.01)

(52) U.S. Cl.
  CPC ........... *B60W 10/08* (2013.01); *G01R 31/007* (2013.01); *G01R 31/343* (2013.01); *B60L 2240/423* (2013.01); *B60L 2240/425* (2013.01); *B60L 2250/10* (2013.01); *B60W 2400/00* (2013.01); *B60W 2710/083* (2013.01); *B60Y 2200/91* (2013.01); *B60Y 2200/92* (2013.01); *Y02T 10/645* (2013.01); *Y02T 10/72* (2013.01); *Y02T 10/7275* (2013.01)

(58) Field of Classification Search
  CPC ........ B60L 3/12; B60L 15/20; B60L 2250/10; B60L 2240/423; B60L 2240/425; G01R 31/007; G01R 31/343; B60Y 2200/91; B60Y 2200/92
  See application file for complete search history.

(56) References Cited

U.S. PATENT DOCUMENTS

| | | | | |
|---|---|---|---|---|
| 4,916,368 A * | 4/1990 | Onoda | ................... | H02P 25/03 318/723 |
| 5,650,706 A * | 7/1997 | Yamada | .............. | B60L 11/1803 318/400.17 |
| 5,689,166 A * | 11/1997 | Nagayama | ........... | H02K 21/046 318/721 |
| 6,037,692 A * | 3/2000 | Miekka | ............... | B60L 11/1807 310/181 |
| 6,051,951 A * | 4/2000 | Arai | ........................ | B60K 6/26 180/65.1 |
| 6,407,521 B1* | 6/2002 | Raftari | ................... | B60K 6/445 318/245 |
| 6,427,794 B1* | 8/2002 | Raftari | ................... | B60K 6/445 180/65.1 |
| 6,679,346 B2 | 1/2004 | Raftari et al. | | |
| 7,531,982 B2* | 5/2009 | Okamura | ........... | B60L 11/1803 318/432 |
| 2002/0047346 A1* | 4/2002 | Miekka | ............... | B60L 11/1807 310/68 B |
| 2008/0157706 A1* | 7/2008 | Loudot | ................. | H02P 25/092 318/701 |
| 2010/0109586 A1* | 5/2010 | Matsui | .................... | B60L 11/14 318/400.04 |
| 2015/0142232 A1* | 5/2015 | Tabata | ................... | B60K 6/445 701/22 |
| 2016/0091568 A1* | 3/2016 | Weber | .................. | G01R 31/343 318/490 |

FOREIGN PATENT DOCUMENTS

| | | |
|---|---|---|
| JP | 2013-027287 A | 2/2013 |
| KR | 10-2009-0055321 A | 6/2009 |
| KR | 10-0934041 | 6/2009 |
| KR | 10-1019123 | 5/2010 |
| KR | 10-1210825 | 12/2012 |
| KR | 10-1292553 B1 | 8/2013 |

* cited by examiner

METHOD FOR DIAGNOSING DEMAGNETIZATION OF MOTOR OF ECO-FRIENDLY VEHICLE

CROSS-REFERENCE TO RELATED APPLICATION

This application claims under 35 U.S.C. § 119(a) the benefit of Korean Patent Application No. 10-2015-0086531 filed on Jun. 18, 2015, the entire contents of which are incorporated herein by reference.

BACKGROUND

(a) Technical Field

The present invention relates to a method for diagnosing demagnetization of a motor of an eco-friendly vehicle, more particularly, to a method for diagnosing an irreversible demagnetization state of a permanent magnet of a traction motor or a hybrid starter-generator (HSG) for engine starting and electricity generation (battery charging) of an eco-friendly vehicle.

(b) Description of the Related Art

As is known, an eco-friendly vehicle such as an electric vehicle (EV), a hybrid electric vehicle (HEV), and a fuel cell electric vehicle (FCEV) typically use a motor (a traction motor) as a driving source for driving a vehicle.

In addition, the eco-friendly vehicle includes a high-voltage battery (a main battery) as a power conversion device for driving the traction motor or an inverter for converting power supplied by a high-voltage power source such as a fuel cell and supplying the power to the motor.

The traction motor is driven by 3-phase alternating current (AC) transmitted from the inverter through a power cable, and the inverter converts high-voltage power direct current (DC) into 3-phase AC while a switching device of a power module is driven according to a pulse width modulation (PWM) signal of a controller.

In addition, a hybrid vehicle uses an engine (an internal combustion engine) as another driving source for driving the vehicle along with a traction motor and also includes a hybrid starter and generator (hereinafter, referred to as an 'HSG') connected to the engine so as to transmit power to the engine.

When operated by a motor, the HSG transmits rotation power to the engine through a belt or the like to start the engine and generates electricity by the rotation power transmitted from the engine through the belt or the like to charge a battery of a vehicle with electric energy generated during the electricity generation.

In a transmission mounted electric device (TMED) system in which a transmission, among components of a power train of the hybrid vehicle, is adhered to the traction motor, the traction motor is used as a driving source of the vehicle and is simultaneously used in regenerative braking in an EV mode and an HEV mode, and the HSG performs engine ignition and idle charging functions.

In a mild hybrid system without a traction motor distinguished from the TMED system, the HSG is used in regenerative braking for receiving rotation power from the engine and then generating electricity during vehicle deceleration or coasting and is simultaneously used as a vehicle driving source for assisting engine output.

A motor of an eco-friendly vehicle, i.e., a traction motor or an HSG, may be a permanent magnet synchronous motor (PMSM), and the permanent magnet-type motor such as the traction motor or the HSG has problems in terms of probability of demagnetization.

A permanent magnet used in a motor has properties whereby magnetic flux is weakened as temperature increases, and is restored as temperature decreases, and in this regard, a phenomenon in which magnetic flux is weakened as temperature increases is referred to as a demagnetization phenomenon.

When a permanent magnet is demagnetized up to a region of which magnetic flux is restorable, this is referred to as reversible demagnetization, and when a permanent magnet is demagnetized up to a region of which magnetic flux is not restorable, this is referred to as irreversible demagnetization. When irreversible demagnetization occurs, magnetic flux is not restored even if the temperature increases to a predetermined temperature or more and then decreases.

In a motor of an eco-friendly vehicle, when the aforementioned irreversible demagnetization of the permanent magnet occurs, performance of the traction motor and the HSG may be degraded, and thus overall vehicle performance, including running performance and charging performance, may be degraded.

When irreversible demagnetization continues, serious problems such as impossible driving, impossible engine starting, and battery damage may occur.

Accordingly, a vehicle needs to monitor an irreversible demagnetization state of a permanent magnet and requires technologies for notifying a driver of a vehicle state or minimizing influence on vehicle performance when irreversible demagnetization occurs.

However, conventionally, hardware such as a temperature sensor is required for determination of demagnetization, and although demagnetization is determined using a sensor or the like, there is no management technology for demagnetization, such as torque compensation, or management technology for reducing influence of irreversible demagnetization on vehicle performance.

It is important to prevent irreversible demagnetization of a permanent magnet of an eco-friendly vehicle, and the availability of management technologies is also important when irreversible demagnetization occurs. Needless to say, irreversible demagnetization itself is a serious problem, but irreversible demagnetization indicates that the probability of another problem of a vehicle is also high, and thus it is more significant to monitor whether irreversible demagnetization of the permanent magnet occurs in the vehicle than irreversible demagnetization itself.

When a motor is not cooled due to failure of a cooling system of an eco-friendly vehicle or when motor temperature cannot be monitored due to failure of a temperature sensor, irreversible demagnetization may occur while the motor is overheated.

Likewise, when irreversible demagnetization occurs once, magnetic force of a permanent magnet may not be restored to an original state, which directly affects output performance of the vehicle.

The above information disclosed in this Background section is only for enhancement of understanding of the background of the invention and therefore it may contain information that does not form the prior art that is already known in this country to a person of ordinary skill in the art.

SUMMARY

The present invention provides a method for diagnosing demagnetization of a motor of a vehicle (e.g., an eco-friendly vehicle), for accurately diagnosing an irreversible demagnetization state of a permanent magnet of a traction motor or a hybrid starter-generator (HSG) without additional use of separate hardware, an increase in costs, and a reduction in efficiency while minimizing influence of irreversible demagnetization of the permanent magnet of the traction motor or the HSG on vehicle performance.

In a preferred embodiment, a method for diagnosing irreversible demagnetization of a permanent magnet of a motor for battery charging during an electricity generating operation of a vehicle includes acquiring operating state information of the motor, determining whether a diagnosis entrance condition including a state in which the motor performs the electricity generating operation is satisfied based on the acquired operating state information of the motor, acquiring a direct current (DC) value in diagnosis, charged in the battery by the electricity generating operation of the motor for diagnosis of irreversible demagnetization of the motor when the diagnosis entrance condition is satisfied, and determining whether irreversible demagnetization occurs by comparing the acquired DC value in diagnosis with a pre-stored DC current value in a normal state of the permanent magnet.

In a preferred embodiment, when a ratio of the DC current value in diagnosis to the DC current value in a normal state is equal to or less than a preset ratio, it is determined that irreversible demagnetization of the permanent magnet of the motor occurs.

When a value of the preset ratio is A, a value of another preset ratio may be B (B<A), and the ratio of the DC current value in diagnosis to the DC current value in a normal state may be $\alpha$ ('$\alpha$=DC current value in diagnosis/DC current value in a normal state'), the determining of whether the irreversible demagnetization occurs may include determining that a current state is a irreversible demagnetization state of the permanent magnet of the motor when B<$\alpha$≤A and performing torque compensation control in irreversible demagnetization, for controlling generation torque of the motor according to a torque command value of the motor compensated for based on the DC current value in diagnosis and the DC current value in a normal state.

The torque compensation control in the irreversible demagnetization may be performed by calculating a torque compensation value for irreversible demagnetization from $\alpha$, the ratio of the DC current value in diagnosis to the DC current value in a normal state, and controlling the generation torque of the motor according to a torque command value to which the torque compensation value for irreversible demagnetization is applied.

The torque compensation value may be determined as a value obtained by adding a value of 'torque command×(1−$\alpha$)' to a torque compensation value of a torque compensation table in which a torque compensation value in a normal state is set according to motor velocity and a torque command for control of generation torque of the motor in a normal state.

The determining of whether the irreversible demagnetization occurs may include determining irreversible demagnetization occurrence of the permanent magnet of the motor and operating a warning device for notifying a driver of the occurrence when $\alpha$≤B.

Information of the DC current value in a normal state of the permanent magnet may be obtained by acquiring and storing information of a DC current value charged in the battery by the electricity generating operation of the motor in a normal state in the same way as a method for acquisition of information of the DC current value in diagnosis when an operating state of the same motor in a normal state satisfies the same condition as the diagnosis entrance condition for diagnosis of irreversible demagnetization of the permanent magnet of the motor.

The information of the DC current value in a normal state of the permanent magnet may be acquired and stored when an operating state of the motor in an initial operation satisfies the same condition as the diagnosis entrance condition assuming that a motor state in the initial operation after introduction of the vehicle is a normal state.

The motor may be a hybrid starter and generator (HSG) connected to an engine of the vehicle so as to transmit power to the engine and for charging the battery in engine starting and electricity generation.

A diagnosis entrance condition may include an idle charging state in which the HSG performs an electricity generating operation by rotation power transmitted from the engine in an engine idle driving state.

An average value during a preset time period or more of a DC current value charged in the battery by an electricity generating operation of the HSG satisfying the diagnosis entrance condition may be obtained as the DC current value in diagnosis.

The motor may be a traction motor used as a driving source for vehicle driving.

A diagnosis entrance condition may include a regenerative charging state as an electricity generation operating state of a traction motor.

The diagnosis entrance condition may further include a condition in which a torque command of the traction motor during regeneration charging of the traction motor is within a preset range 1 and a condition in which a temperature of the traction motor is within a preset range 2.

When the diagnosis entrance condition is satisfied, torque command values for torque control of the traction motor may be integrated, DC current values charged in the battery may be integrated by an electricity generating operation of the traction motor, and an integrated DC value obtained by integrating DC current values, while an integrated torque command value obtained by integrating the torque command value reaches a set value, may be derived as the DC current value in diagnosis.

The above and other features of the invention are discussed infra.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

DETAILED DESCRIPTION

Figure 1:
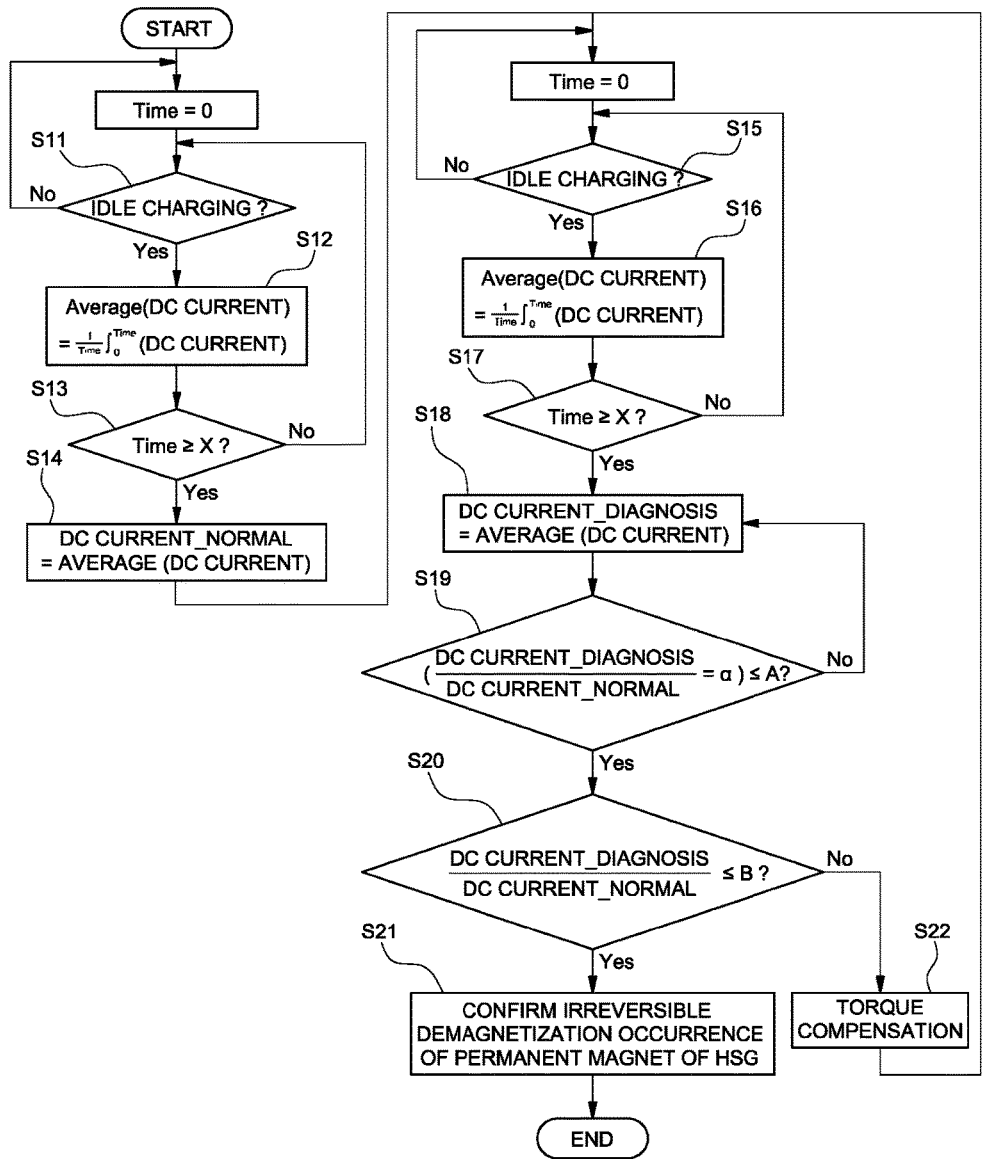
FIG. 1 is a flowchart illustrating a process for diagnosing irreversible demagnetization of a hybrid starter-generator (HSG) and a management process.

Hereinafter reference will now be made in detail to various embodiments of the present invention, examples of which are illustrated in the accompanying drawings and described below.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present invention may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

The present invention provides a method for diagnosing demagnetization of a motor of an eco-friendly vehicle, for accurately diagnosing an irreversible demagnetization state of a permanent magnet of a traction motor or a hybrid starter-generator (HSG) without additional use of separate hardware, an increase in costs, and a reduction in efficiency while minimizing influence of irreversible demagnetization of the permanent magnet of the traction motor or the HSG on vehicle performance.

First, a method for diagnosing irreversible demagnetization of a motor according to an exemplary embodiment of the present invention, i.e., a method for diagnosing an irreversible demagnetization state of a permanent magnet of an HSG in a hybrid vehicle and responding to occurrence of irreversible demagnetization will be described below.

FIG. 1 is a flowchart illustrating a process for diagnosing irreversible demagnetization of an HSG and a management process. As illustrated in FIG. 1, a diagnosis entrance condition for diagnosing irreversible demagnetization of a permanent magnet of the HSG, that is, an operation state condition of the HSG for performing diagnosis may be preset.

The diagnosis entrance condition may be applied in the same way to a calculation process of DC current in a normal state as well as a calculation process of DC current in actual diagnosis, which will be described below for comparison under the same conditions.

In the present invention, diagnosis of irreversible demagnetization of a permanent magnet of an HSG may be set to be performed when an operating state of the HSG is checked and corresponds to a predetermined condition (refer to operation S15), and the condition may also be applied in the same way to a calculation process of DC current in a normal state for deriving and storing a diagnosis comparison value.

The diagnosis of irreversible demagnetization may be set to be performed when idle charging of the HSG is performed.

In the case of a hybrid vehicle including components of a power train of a TMED system, idle charging is performed under the same predetermined driving condition (in the same driving point during vehicle stop) and thus the hybrid vehicle with the TMED system has high reliability comparing with a DC current value (DC current charged in a battery) supplied to the battery during charging under the same conditions.

Accordingly, in the present invention, while the HSG generates electricity by rotation power transmitted from an engine to charge a battery in an idle operating state of the engine, irreversible demagnetization of a permanent magnet may be diagnosed using DC current charged in the battery.

The DC current information is an existing parameter monitored by a controller, and thus when the DC current information is used for diagnosis of irreversible demagnetization, as in the present invention, additional operation or hardware is not required.

Accordingly, DC current information in a normal state and DC current information in actual diagnosis, which are obtained under the same conditions, may be compared to determine whether irreversible demagnetization of a permanent magnet of an HSG occurs, and the method for diagnosing irreversible demagnetization according to the present invention may include calculating the DC current information in a normal state as a diagnosis comparison value.

First, for diagnosis of irreversible demagnetization of the permanent magnet of the HSG, assuming that the permanent magnet of the HSG is in a normal state in an initial operation after introduction of a vehicle, a DC current value (DC current_normal) in a normal state during the initial operation of the vehicle may be calculated and stored, as illustrated in FIG. 1.

In this case, a controller checks whether the HSG is in an idle charging state in a normal state during the initial operation (S11) and then when a current state is the idle charging state, a DC current value charged in a battery via an electricity generating operation of the HSG may be calculated and stored (S12 to S14).

A condition in which the DC current value in a normal state is calculated for comparison with the DC current monitored as described later for diagnosis of irreversible demagnetization under the same conditions may be set as that of idle charging in operation S11.

In a preferred embodiment, the DC current value (DC current_normal) in a normal state is used as DC current average (Average (DC current)) for a preset time (X) or more during idle charging (S12 to S14), and an average value during idle charging for the preset time or more may be used so as to enhance reliability of diagnosis.

The DC current charged in a battery during an electricity generating operation of the HSG is a parameter that is already monitored by a controller through a sensor or the like in a hybrid vehicle. Acquisition of a DC current value is well known in the art, and thus a detailed description thereof will be omitted here.

Then, information of an operating state of the HSG may be acquired and checked during a future vehicle operation (S15), and when a current state is an idle charging state, an irreversible demagnetization diagnosis process may be begun, and a DC current value in diagnosis may be calculated in the same way in the idle charging state (S16 to S18).

In this case, the DC current value (DC current_diagnosis) in diagnosis may be used as DC current average for a preset time (X) or more during idle charging (S16 to S18), and an average value during idle charging for the preset time or more may be used so as to enhance reliability of diagnosis.

Then, the controller may compare the calculated DC current value (DC current_diagnosis) in diagnosis with the DC current value (DC current_normal) in a normal state to determine whether irreversible demagnetization occurs and a demagnetization degree. In this regard, when a ratio of the DC current monitored during diagnosis, i.e., the DC current value (DC current_diagnosis) in diagnosis to the stored DC current value (DC current_normal) in a normal state is equal to or less than a preset ratio 1, it may be determined that irreversible demagnetization occurs.

That is, when a ratio of the DC current value (DC current_diagnosis) in diagnosis to the DC current value (DC current_normal) in a normal state, that is, (DC current_diagnosis)/(DC current_normal) is defined as a, and the preset ratio 1 is A, if $\alpha \leq A$, it may be determined that irreversible demagnetization occurs (S19).

In a preferred embodiment, a process for managing irreversible demagnetization through torque compensation control according to an occurrence degree of irreversible demagnetization so as to minimize influence on vehicle performance due to the irreversible demagnetization may be performed (S22) or a process for confirming failure and notifying a driver of the failure through a warning device may be performed (S21).

In this case, when a preset ratio 2 is B (B<A), if $B<\alpha \leq A$, it may be determined that irreversible demagnetization occurs and then torque compensation control may be performed on the HSG (S19, S20, and S22), and when a ratio of the DC current value (DC current_diagnosis) in diagnosis to the stored DC current value (DC current_normal) in a normal state is equal to or less than the preset ratio 2, that is, when $\alpha \leq B$, irreversible demagnetization occurrence of a permanent magnet of the HSG may be confirmed and warning may be given through the warning device (S20 and S21).

Hereinafter, torque compensation control performed for determination of irreversible demagnetization of an HSG will be described.

A controller of a vehicle includes a torque compensation table shown in Table 1 below for torque control of a motor of a general eco-friendly vehicle, that is, a traction motor or an HSG, the torque compensation table has a torque axis and a velocity axis and sets a torque compensation value according to torque and velocity, and the torque compensation value derived from the torque compensation table may be applied so as to perform charging torque (generation torque) control during regenerative charging of the traction motor or charging torque (generation torque) of the HSG.

In this case, when a compensation value according to a torque command (Tq) and a motor velocity (rpm) is derived from the torque compensation table, a compensation value may be applied to the torque command so as to perform torque control on a motor according to the torque command to which the compensation value is applied.

In the present invention, torque may be further compensated by as much as the reduced current ratio using a linear relation (current amplitude and torque have a proportional linear relation with a predetermined ratio) between current amplitude and torque while using an existing torque compensation table, that is, a torque compensation table for determination of a torque compensation value in a motor normal state.

In this case, the reduced current ratio may be 1−α (here, α=(DC current_diagnosis)/(DC current_normal)), and thus a value obtained by adding 'torque command×(1−α)' to a torque compensation value (which is a torque compensation value used in the motor normal state) of the existing torque compensation table may be determined as a torque compensation value for irreversible demagnetization.

That is, the torque compensation value for irreversible demagnetization may be interpreted as a compensation value to which a torque compensation value (torque to be further compensated for irreversible demagnetization=torque command×(1−α)) is further applied by as much as the reduced current ratio due to irreversible demagnetization as well as the existing torque compensation value.

The torque compensation value for irreversible demagnetization may be derived by multiplying a compensation value of the existing torque compensation table by a value of 'torque command×(1−α)' in real time or may be derived from Table 2 below while the torque compensation table for irreversible demagnetization shown in Table 2 is pre-input to the controller.

TABLE 1

Existing Torque Compesation Table

| | rpm | | |
|---|---|---|---|
| Tq | −y | 0 | y |
| c | i | i | i |
| b | j | j | j |
| a | k | k | k |
| 0 | 0 | 0 | 0 |
| −a | l | l | l |
| −b | m | m | m |
| −c | n | n | n |

TABLE 2

Torque Compensation Table for irreversible memagnetization

| | rpm | | |
|---|---|---|---|
| Tq | −y | 0 | y |
| c | i + c*(1 − a) | i + c*(1 − a) | i + c*(1 − a) |
| b | j + b*(1 − a) | j + b*(1 − a) | j + b*(1 − a) |
| a | k + a*(1 − a) | k + a*(1 − a) | k + a*(1 − a) |
| 0 | 0 | 0 | 0 |
| −a | l − a*(1 − a) | l − a*(1 − a) | l − a*(1 − a) |
| −b | m − b*(1 − a) | m − b*(1 − a) | m − b*(1 − a) |
| −c | n − c*(1 − a) | n − c*(1 − a) | n − c*(1 − a) |

In Tables 1 and 2 above, '*' refers to 'x'.

A torque ratio to be compensated using the compared DC current values (DC current in a normal state and DC current in diagnosis) may be calculated using the existing torque compensation table during torque compensation control and then torque compensation may be performed based on a current torque command.

When the torque compensation value is determined for irreversible demagnetization, charging torque control of an HSG may be performed according to a torque command to which the torque compensation value is applied.

Hereinafter, as a method for diagnosing irreversible demagnetization of a motor according to the present invention, a method for diagnosing an irreversible demagnetization state of a permanent magnet of a traction motor and managing irreversible demagnetization when irreversible demagnetization occurs will be described.

Figure 2:
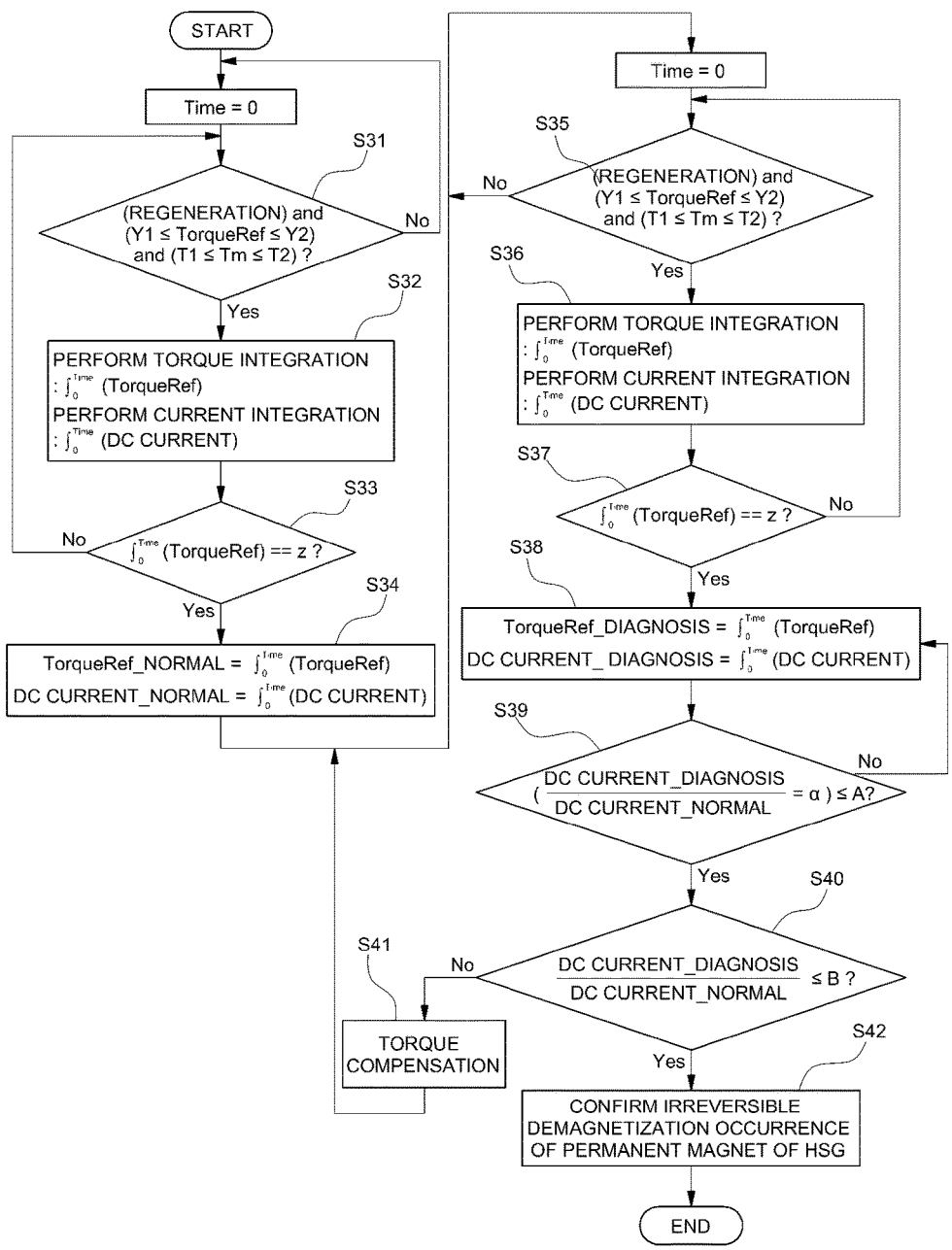
FIG. 2 is a flowchart illustrating a process for diagnosing irreversible demagnetization of a traction motor and managing irreversible demagnetization.

FIG. 2 is a flowchart illustrating a process for diagnosing irreversible demagnetization of a traction motor and managing irreversible demagnetization. As illustrated in FIG. 2, a diagnosis entrance condition for diagnosing irreversible demagnetization of a permanent magnet of a traction motor, that is, an operation state condition of the traction motor HSG for performing diagnosis may be preset.

The diagnosis entrance condition may be applied in the same way to a calculation process of DC current value (DC current_normal) in a normal state as well as a calculation process of DC current value (DC current-diagnosis) in diagnosis, which will be described below for comparison under the same conditions.

Irreversible demagnetization may be diagnosed on the traction motor under a regenerative (i.e., a generating operation) condition, and when irreversible demagnetization is diagnosed during driving of the traction motor, an output value is greatly affected by an external condition (road friction, road gradient, etc.) of a vehicle.

On the other hand, regeneration may be performed by as much as control during regeneration such that a diagnosis condition is constant and diagnosis reliability is increased, and thus diagnosis logic may be set so as to diagnose irreversible demagnetization of a permanent magnet during regenerative charging of the traction motor.

However, a diagnosis entrance condition of irreversible demagnetization may be limited to a main regenerative driving point of a vehicle, and thus whether a torque command (a charging torque command) for a traction motor during regeneration is within a preset range 1 may be checked ($Y1 \leq TorqueRef \leq Y2$), and simultaneously whether temperature ($T1 \leq Tm \leq T2$) of the traction motor is within a preset range 2 may be checked (S31).

The motor temperature in a predetermined range is applied as described above because, when an integrated amount of torque command in a normal state and an integrated amount of torque command in diagnosis are compared, if the two integrated amounts are equal, the same driving point may be assumed, but the driving point may be changed according to temperature even if the two integrated amounts are equal, and accordingly, a motor temperature range for diagnosis needs to be considered.

Accordingly, in the present invention, when the above condition is satisfied, while a traction motor generates electricity to charge a battery, irreversible demagnetization of a permanent magnet may be diagnosed using information of DC current charged in the battery.

The DC current information is an existing parameter monitored by the controller, and thus as in the present invention, when DC current information is used for diagnosis of irreversible demagnetization, additional operation or hardware is not required.

Accordingly, the DC current information in a normal state and DC current information in diagnosis, which are obtained under the same conditions, may be compared with each other to determine whether irreversible demagnetization of a permanent magnet of a traction motor occurs.

First, for diagnosis of irreversible demagnetization of the permanent magnet of the traction motor, assuming that the permanent magnet of the traction motor is in a normal state in an initial operation after introduction of a vehicle, DC current value (DC current_normal) in a normal state during the initial operation of the vehicle may be calculated and stored, as illustrated in FIG. 2 (S32 to S34).

In this case, a controller acquires information of an operating state of the traction motor and checks whether the diagnosis entrance condition is satisfied based on the information in a normal state of an initial operation (S31), and when an entrance condition is satisfied, the DC current value (DC current_normal) charged in the battery via generation of the traction motor may be calculated and stored (S32 to S34).

A condition for calculation of the DC current value (DC current_normal) in a normal state for comparison with DC current monitored for determination of irreversible demagnetization under the same conditions as described later may be set as a condition in which diagnosis of irreversible demagnetization of a permanent magnet of the traction motor is begun, that is, the aforementioned diagnosis entrance condition.

In a preferred embodiment, the DC current value (DC current_normal) information in a normal state may be an integrated value of DC current, obtained by integrating DC current values, from a time point at which the aforementioned diagnosis entrance condition is satisfied (refer to operation S34).

Torque command values (charging torque command values) (TorqueRef) for torque control (charging torque control) of the traction motor may be integrated from a time point at which the condition is satisfied and DC current values may be integrated up to a time point at which the integrated value reaches a preset value Z (refer to S33).

Unlike idle charging of the HSG, regenerative charging of the traction motor may not be performed in a predetermined driving point, and cases with the same driving point or the same condition need to be compared for comparison between a DC current value in a normal state and a DC current when irreversible demagnetization occurs.

To this end, in the present invention, integrated torque values may be used, and information about DC current values with integrated torque values acquired in the same time point, that is, information about DC current value (DC current_normal) in a normal state and information about DC current value (DC current_diagnosis) in diagnosis may be compared to determine whether irreversible demagnetization occurs.

Here, the information about DC current value (DC current_normal) in a normal state and the information about DC current value (DC current_diagnosis) in diagnosis are integrated DC current values and integrated DC current values obtained by integrating DC current until the integrated torque command values reach the set value Z after the diagnosis entrance condition is satisfied.

Torque in regeneration and battery charging DC current may be proportional to each other, and when integrated torque amounts are the same despite different driving points, DC current amounts integrated while torque is integrated may also be the same.

In consideration of this point, DC current as DC current information may be integrated until an integrated amount of torque command reaches the set value Z to calculate the integrated DC current value, and the DC current information in a normal state and DC current information in irreversible demagnetization may be compared with each other to determine whether irreversible demagnetization of a permanent magnet occurs.

However, the integrated torque amounts may be changed when torque is remarkably changed, and thus torque may be integrated when a condition (Y1<TorqueRef<Y2) in which torque command (TorqueRef) is within a preset range 1 is satisfied among the aforementioned diagnosis entrance conditions.

In the present invention, the range of the torque command may be limited to a main regenerative driving point, and a range for satisfying the condition may be enlarged.

The DC current charged in a battery during a regeneration operation of the traction motor is a parameter that is already monitored by a controller through a sensor or the like in an eco-friendly vehicle, and acquisition of a DC current value is well known in the art, and thus a detailed description thereof will be omitted here.

As described, the controller may integrally calculate and store a torque command integrated (TorqueRef_normal) in a normal state and an integrated DC current value (DC current_normal) as information of DC current value (S34), and comparison may be performed under the same diagnosis entrance condition, that is, during regeneration, a torque command condition within the preset range 1, and a temperature condition of a traction motor in the preset range 2, for determination of irreversible demagnetization, thereby enhancing diagnosis reliability.

Then an operation state of the traction motor may be checked during a future vehicle operation (S35), and when the aforementioned diagnosis entrance condition is satisfied, an irreversible demagnetization diagnosis process may be begun, and torque command may be integrated in the same way as in a normal state to calculate the DC current value (DC current_diagnosis) in diagnosis (S36).

In this case, the DC current value (DC current_diagnosis) in diagnosis is used as integrated DC current values (TorqueRef_diagnosis) calculated by integrating DC current until integrated torque command values reach the same set value Z as in a normal state after the diagnosis entrance condition is satisfied (refer to operation S37).

The aforementioned HSG may calculate an average value of DC current for a preset time (X) or more as DC current value (DC current_diagnosis) information for determination of whether irreversible demagnetization occurs and may use the average value as a comparison value, but the traction motor may use an integrated value of DC current as the DC current value (DC current_diagnosis) information as a comparison value.

Accordingly, the controller may compare the obtained DC current value (which is an integrated DC current value) (DC current_diagnosis) in diagnosis with the stored DC current value (which is an integrated DC current value) (DC current_normal) to determine whether irreversible demagnetization occurs and a demagnetization degree, and when a ratio of the DC current value (DC current_diagnosis) in diagnosis to a DC current value (DC current_normal) in a normal state is equal to or less than a preset 3, it may be determined that irreversible demagnetization occurs.

That is, when a ratio of the DC current value (DC current_diagnosis) in diagnosis to the DC current value (DC current_normal) in a normal state, that is, (DC current_diagnosis)/(DC current_normal) is defined as a, and the preset ratio 3 is A, if $\alpha \le A$, it may be determined that irreversible demagnetization occurs (S39).

In a preferred embodiment, a process for managing irreversible demagnetization through torque compensation control according to an occurrence degree of irreversible demagnetization so as to minimize influence on vehicle performance due to the irreversible demagnetization may be performed or a process for confirming failure and notifying a driver of the failure through a warning device may be performed.

In this case, when a preset ratio 4 is B (B<A), if $B < \alpha \le A$, it may be determined that irreversible demagnetization occurs and then torque compensation control may be performed on the traction motor (S39, S40, and S41), and when a ratio of the DC current value (DC current_diagnosis) in diagnosis to the stored DC current value (DC current_normal) in a normal state is equal to or less than the preset ratio 4, that is, when $\alpha \le B$, irreversible demagnetization occurrence of a permanent magnet of the traction motor may be confirmed and warning may be given through the warning device (S40 and S42).

In the diagnosis of irreversible demagnetization during regeneration, when an integrated torque command value may be pre-compared (using the same preset value (Z)) and integrated torque command values in a normal state and diagnosis are the same, whether irreversible demagnetization occurs may be determined using DC current value information as integrated DC current values that have been calculated thus far.

In addition, when the integrated DC current values are compared with the integrated torque command values, a DC current amount that varies according to temperature of a traction motor may not be considered, and thus when the temperature of the traction motor is within a preset temperature range (preset range 2), torque command integration may be performed.

Torque compensation control performed during determination of whether irreversible demagnetization of the traction motor occurs is not different from the aforementioned torque compensation control of the HSG and may be performed in the same way as the aforementioned torque compensation control of the HSG, which has been described in detail and thus a detailed description thereof will be omitted herein.

In the diagnosis of irreversible demagnetization of the traction motor, the aforementioned diagnosis entrance condition includes a temperature range condition of the traction motor, and thus errors of variation in DC current according to temperature may be reduced, but when a motor temperature condition is too narrowly determined for acquisition of an accurate DC current value, a number of diagnosis times may be remarkably reduced to degrade a diagnosis function due to motor temperature that is frequently changed.

Accordingly, when a range of an integrated torque command value (TorqueRef) is determined to a region that is less sensitive to temperature, influence of motor temperature may be reduced and a temperature range may be more widely determined, thereby increasing a number of diagnosis times.

A current map in which a current command value is set according to temperature, vehicle velocity condition, and a torque command value may be applied to a general eco-friendly vehicle such as a hybrid vehicle, and influence of temperature may be differently affected according to velocity and torque.

Accordingly, when the applied current map is analyzed, a period with low variation in current command according to temperature may be recognized, and a variation width of the current command may be recognized, and thus when the period and the variation width are used to determine irreversible demagnetization, reliability may be further enhanced.

For example, when variation in a current command in a predetermined temperature period is within 5%, if errors of 5% in a current ratio for determination of irreversible demagnetization may be applied to reduce current with a higher ratio, it may be determined that irreversible demagnetization occurs.

Figure 3:
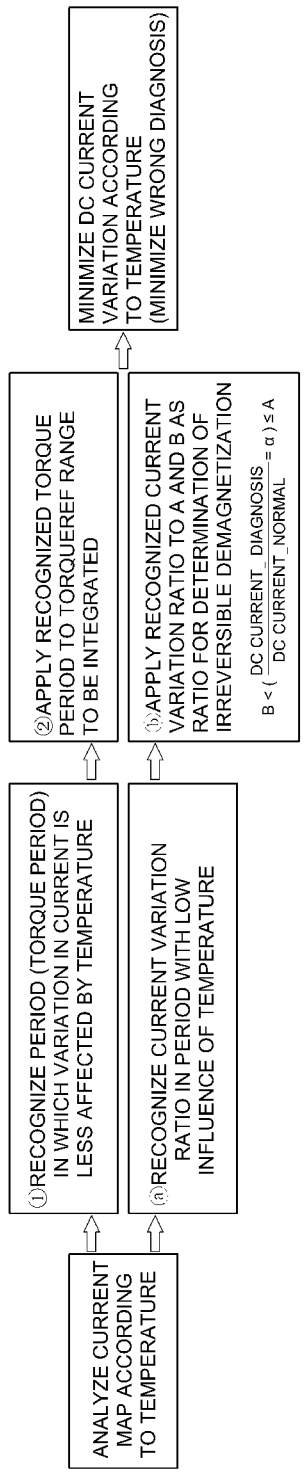
FIG. 3 is a diagram for explanation of a logic setting method via analysis of a current map according to an embodiment of the present invention.

In more detail, as illustrated in FIG. 3, a torque period in which current variation is less affected by temperature may be recognized while considering a main driving point and simultaneously excluding a predetermined high torque range, and the recognized torque period may be applied to setting of a preset range 1 for integrating a torque command (TorqueRef).

In addition, a current variation ratio may be recognized in a period in which current variation is less affected by temperature in the current map, and the recognized current variation ratio may be applied to determination of ratio values A and B for determination of irreversible demagnetization.

Accordingly, influence of DC current variation according to temperature may be minimized and an incorrect diagnosis may be minimized.

Accordingly, in the method for diagnosing irreversible demagnetization of a motor of an eco-friendly vehicle according to the present invention, irreversible demagnetization may be diagnosed using torque command value information and DC current charged in a battery during an electricity generating operation so as to accurately diagnose an irreversible demagnetization state of a permanent magnet of a traction motor or a hybrid starter-generator (HSG) without additional use of separate hardware, an increase in costs, and a reduction in efficiency while minimizing influence of irreversible demagnetization of the permanent magnet of the traction motor or the HSG on vehicle performance.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A method for diagnosing irreversible demagnetization of a permanent magnet of a motor for battery charging, the method comprising:
    acquiring, by a controller, a DC current value in a normal state during initial operation of the permanent magnet;
    diagnosing, by the controller, if irreversible demagnetization of the motor occurs when the motor performs an electricity generating operation;
    acquiring, by a sensor, a direct current (DC) value in diagnosis, by the controller monitoring the DC value charged in a battery, as a result of the electricity generating operation of the motor; and
    determining whether irreversible demagnetization occurs by directly comparing the acquired DC value in diagnosis with the DC current value acquired in the normal state of the permanent magnet,
    wherein, when a ratio of the DC value in diagnosis to the DC current value in the normal state ($\alpha$) is equal to or less than a preset ratio (A), it is determined that irreversible demagnetization of the permanent magnet of the motor occurs, and torque compensation control in irreversible demagnetization is performed,
    wherein the torque compensation control in irreversible demagnetization is performed by calculating a torque compensation value for irreversible demagnetization from $\alpha$, the ratio of the DC value in diagnosis to the DC current value in the normal state, and controlling generation torque of the motor according to a torque command value to which the torque compensation value for irreversible demagnetization is applied, and
    wherein the torque compensation value for irreversible demagnetization is obtained by adding a value of 'torque command×(1−$\alpha$)' to a torque compensation value of a torque compensation table in which the torque compensation value in the normal state is set according to motor velocity and a torque command for control of the generation torque of the motor in the normal state.

2. The method of claim 1, wherein, when a value of the preset ratio is A, a value of another preset ratio is B (B<A), and the ratio of the DC current value in diagnosis to the DC current value in the normal state is $\alpha$ ('$\alpha$=DC current value in diagnosis/DC current value in the normal state'), the determining of whether the irreversible demagnetization occurs comprises determining that a current state is an irreversible demagnetization state of the permanent magnet of the motor when B<$\alpha$≤A and performing torque compensation control in irreversible demagnetization, for controlling the generation torque of the motor according to the torque command value of the motor compensated for based on the DC current value in diagnosis and the DC current value in the normal state.

3. The method of claim 1, wherein the determining of whether the irreversible demagnetization occurs comprises determining irreversible demagnetization occurrence of the permanent magnet of the motor and operating a warning device for notifying a driver of the occurrence when $\alpha$≤B.

4. The method of claim 1, wherein information of the DC current value in the normal state of the permanent magnet is obtained by acquiring and storing information of a DC current value charged in the battery by the electricity generating operation of the motor in the normal state in the same way as a method for acquisition of information of the DC current value in diagnosis when an operating state of the motor in the normal state satisfies the same condition as the diagnosis entrance condition for diagnosis of irreversible demagnetization of the permanent magnet of the motor.

5. The method of claim 4, wherein the information of the DC current value in the normal state of the permanent magnet is acquired and stored when an operating state of the motor in an initial operation satisfies the same condition as the diagnosis entrance condition assuming that a motor state in the initial operation after introduction of the vehicle is the normal state.

6. The method of claim 1, wherein the motor is a hybrid starter and generator (HSG) connected to an engine of the vehicle so as to transmit power to the engine and for charging the battery in engine starting and electricity generation.

7. The method of claim 6, wherein a diagnosis entrance condition comprises an idle charging state in which the HSG performs an electricity generating operation by rotation power transmitted from the engine in an engine idle driving state.

8. The method of claim 6, wherein an average value during a preset time period or more of a DC current value charged in the battery by an electricity generating operation of the HSG satisfying the diagnosis entrance condition is obtained as the DC current value in diagnosis.

9. The method of claim 1, wherein the motor is a traction motor used as a driving source for vehicle driving.

10. The method of claim 9, wherein a diagnosis entrance condition comprises a regenerative charging state as an electricity generation operating state of a traction motor.

11. The method of claim 10, wherein the diagnosis entrance condition further comprises a condition in which a torque command of the traction motor during regeneration charging of the traction motor is within a preset range 1 and a condition in which a temperature of the traction motor is within a preset range 2.

12. The method of claim 9, wherein, when the diagnosis entrance condition is satisfied, torque command values for torque control of the traction motor are integrated, DC current values charged in the battery by an electricity generating operation of the traction motor are integrated, and an integrated DC value obtained by integrating DC current values, while an integrated torque command value obtained by integrating the torque command value reaches a set value, is derived as the DC current value in diagnosis.

\* \* \* \* \*